United States Patent [19]

Kohno et al.

[11] Patent Number: 4,865,455

[45] Date of Patent: Sep. 12, 1989

[54] OPTICAL DEVICE HAVING A VARIABLE GEOMETRY FILTER USABLE FOR ALIGNING A MASK OR RETICLE WITH A WAFER

[75] Inventors: Michio Kohno; Akiyoshi Suzuki, both of Tokyo, Japan

[73] Assignee: Canon Kabushiki Kaisha, Tokyo, Japan

[21] Appl. No.: 314,272

[22] Filed: Feb. 22, 1989

Related U.S. Application Data

[63] Continuation of Ser. No. 946,166, Dec. 23, 1986, abandoned, which is a continuation of Ser. No. 759,882, Jul. 29, 1985, abandoned.

[30] Foreign Application Priority Data

Jul. 31, 1984 [JP] Japan ............................ 59-161056

[51] Int. Cl.$^4$ ............................................ G01B 11/00
[52] U.S. Cl. ................................. 356/400; 250/548; 356/401
[58] Field of Search .............. 356/375, 399, 400, 401; 350/331 R; 250/548, 557, 561

[56] References Cited

U.S. PATENT DOCUMENTS

| | | | |
|---|---|---|---|
| 4,199,219 | 4/1980 | Suzki et al. | 350/6.1 |
| 4,202,627 | 5/1980 | Suzki et al. | 356/401 |
| 4,251,129 | 2/1981 | Suzki et al. | 356/401 |
| 4,641,035 | 2/1987 | Suzuki et al. | 250/548 |
| 4,717,257 | 1/1988 | Kaneta et al. | 356/400 |

Primary Examiner—F. L. Evans
Attorney, Agent, or Firm—Fitzpatrick, Cella, Harper & Scinto

[57] ABSTRACT

An optical device including a spatial filter disposed at a location coincident with or in close proximity to a position optically conjugate with a pupil of a projection optical system for projecting a pattern of a mask onto a wafer. The spatial filter is adapted to intercept a light beam specularly reflected by a surface of the mask and/or by a surface of the wafer to thereby allow photoelectric detection of a light beam scatteringly reflected from the mask surface and/or the wafer surface. The spatial filter has a variable geometry filtering portion to assume high-accuracy photoelectric detection of the scatteringly reflected light beam.

11 Claims, 7 Drawing Sheets

OPTICAL DEVICE HAVING A VARIABLE GEOMETRY FILTER USABLE FOR ALIGNING A MASK OR RETICLE WITH A WAFER

This application is a continuation of application Ser. No. 946,166 filed Dec. 23, 1986, now abandoned, which is a continuation of application Ser. No. 759,882, filed on July 29, 1985, now abandoned.

FIELD OF THE INVENTION AND RELATED ART

This invention relates to an optical device and, more particularly, to an optical device for use in alignment of a mask or reticle with a wafer to be effected prior to an exposure operation for transferring a pattern of the mask or reticle onto the wafer.

For manufacturing semiconductor devices such as integrated circuits (ICs), large scaled integrated circuits (LSIs), very large scaled integrated circuits (VLSIs), etc., projection type exposure apparatuses have been used to project, onto a semiconductor wafer, a circuit pattern formed on a photomask or reticle (which hereinafter will be referred to simply as "mask").

Figure 1:
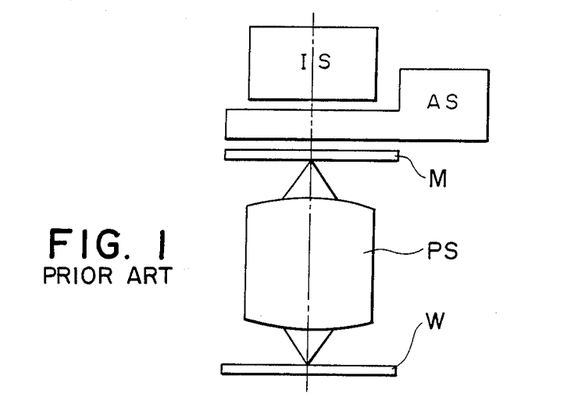
FIG. 1 is a schematic view of an example of alignment and exposure apparatus of projection exposure type, for use in the manufacture of semiconductor devices.

FIG. 1 schematically shows an example of such exposure apparatus. The exposure apparatus includes a projection system PS which is composed of lenses or mirrors to project a pattern of a mask M onto a wafer W. An illumination system IS supplies a light beam to illuminate the mask M so that the wafer W is exposed to the pattern of the mask M. An alignment system AS is provided to bring the mask M and the wafer W into alignment with each other in order that the pattern of the mask M, when it is projected onto the wafer W surface, is accurately overlaid on the pattern or patterns which have already been transferred onto the wafer W.

As is known in the art, such an alignment system wherein the alignment of the mask M with the wafer W is effected with the use of a beam passing through the projection system PS, called a through-the-lens (TTL) alignment system, assures high-accuracy alignment.

According to the TTL alignment technique, alignment marks formed on the mask M and the wafer W respectively are illuminated and, by utilizing diffraction of the light caused by the alignment marks, whether or not these marks are positioned in alignment with each other is detected. A proposal for such alignment method, utilizing diffraction light from alignment mark, has been made in U.S. Pat. No. 4,199,219 issued Apr. 22, 1980. According to this proposal, the diffraction light from the alignment mark is detected by effecting spatial filtering at a position optically equivalent to a pupil of a projection lens.

Figure 2:
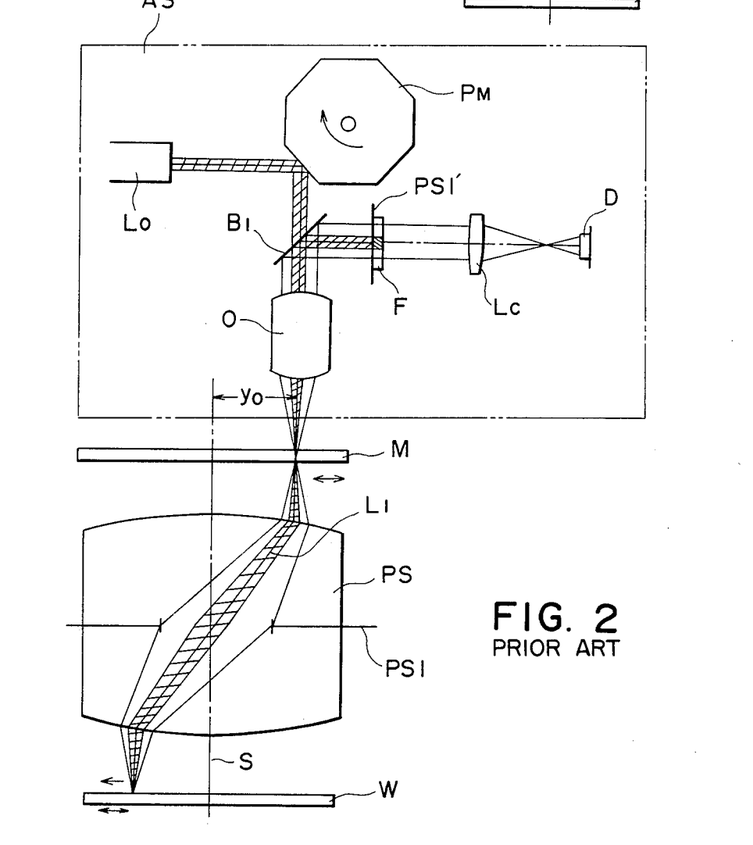
FIG. 2 is a schematic view showing an example of optical arrangement for use in alignment of a mask and a wafer, in the course of manufacture of semiconductor devices.

FIG. 2 is a schematic view showing an example of optical arrangement including an alignment system according to this proposal. In FIG. 2, a laser beam emitted from a laser source Lo is reflected by a polygonal mirror PM, rotating at a constant speed, and the reflected laser beam passes through a beam splitter B1 and then is focused by an f-θ objective lens 0 on a mask M. The laser beam passing through the mask M is again focused by a projection system PS on a surface of a wafer W. The laser beam incident on the wafer W surface is reflected thereby and is again focused by the projection system PS on the mask M. After passing through the mask M in the opposite direction, i.e. upwardly in FIG. 2, the laser beam is directed by the objective lens O to the beam splitter B1 whereby it is reflected toward a detection system which is composed of a spatial filter F, a lens Lc and a photoreceptor or photodetector D. The photodetector D may be disposed in proximity to the filter F. The filter F is located at a position PS1′ coincident with or in close proximity to a position which is optically conjugate with a pupil PS1 of the projection system PS with respect to the objective lens O. The photodetector D is disposed to receive a light beam passed through the filter F.

As the polygonal mirror PM rotates at a constant speed, the laser beam emitted from the laser source Lo is scanningly deflected by the polygonal mirror PM, so that the surface of the mask M as well as the surface of the wafer W are scanned in a direction of arrow and at a constant speed with the laser beam passed through the objective lens O having f-θ characteristics. The filter F has a light-blocking portion formed at its central area, adapted to intercept a regularly reflected light component, i.e. the zero-th order diffraction light component, from the mask M surface and from the wafer W surface.

Actually, the alignment and exposure apparatus further includes another set of optical elements the same as those disposed, in FIG. 2, above the mask M, in order to detect the alignment of the mask M with the wafer W at two positions.

Figure 3A:
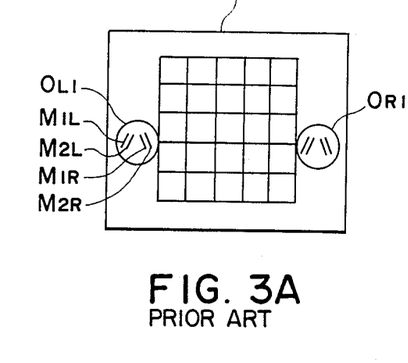
FIG. 3A is a plan view schematically showing alignment marks on a mask.
Figure 3B:
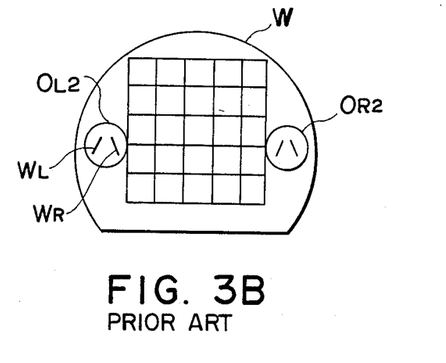
FIG. 3B is a plan view schematically showing alignment marks on a wafer.

Each of the mask M and the wafer W has formed thereon alignment marks such as shown in FIGS. 3A and 3B, respectively, for allowing the mask M and the wafer W to be brought into a predetermined positional relation, namely to bring them into alignment. As shown in FIG. 3A, the mask M has a lefthand side alignment mark OL1 composed of two parallel mark elements M1L and M2L inclined with an angle of 45 degrees and two parallel mark elements M1R and M2R inclined oppositely with an angle of 45 degrees, and a right-hand side alignment mark OR1 composed of similar mark elements. On the other hand, as shown in FIG. 3B, the wafer W has a left-hand side alignment mark OL2 composed of a mark element WL inclined with an angle of 45 degrees and another mark element WR inclined oppositely with the same angle 45 degrees, and a right-hand side alignment mark OR2 composed of similar mark elements.

Figure 4A:
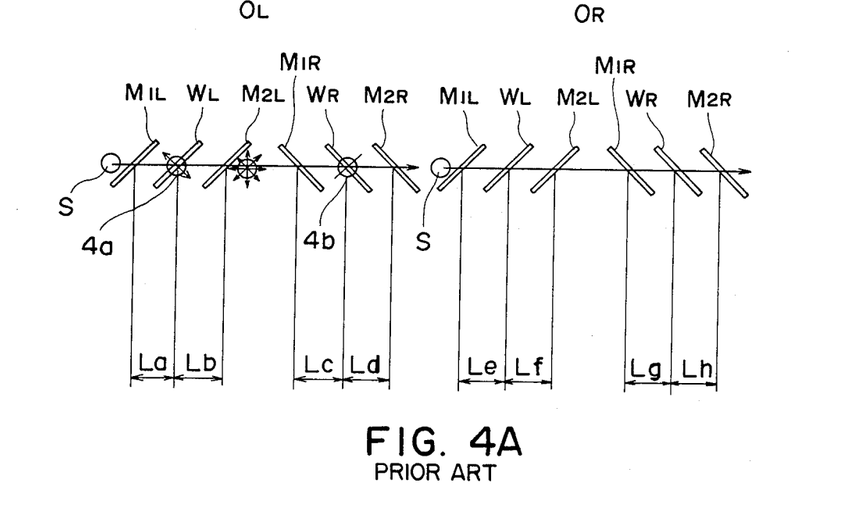
FIG. 4A is a schematic view showing the positional relation between the alignment marks on the mask and the wafer hen the alignment therebetween is achieved.

These alignment marks are so formed on the mask M and the wafer W that, when the mask-to-wafer alignment is achieved, the mark elements WL and WR of the left-hand side alignment mark OL2 on the wafer W are sandwiched between the mark elements M1L to M2R of the left-hand side alignment mark OL1 on the mask M, while the mark elements of the right-hand side alignment mark OR2 on the wafer W are sandwiched between the mark elements of the right-hand side alignment mark OR1 of the mask M, such as shown in FIG. 4A, when the mask M and the wafer W are viewed from the above. More specifically, the alignment of the mask M and the wafer W is achieved when the following relations are satisfied:

La=Lb
Lc=Ld
Le=Lf
Lg=Lh where
La=the interval between the mark elements M1L and WL,
Lb=the interval between the mark elements WL and M2L,
Lc=the interval between the mark elements M1R and WR, Ld=the interval between the mark elements WR and M2R, Le=the interval between the mark elements M1L and WL of the right-hand alignment marks OR1 and OR2, respectively, Lf=the interval between the mark elements WL and M2L of the right-hand alignment marks OR1 and OR2, respectively, Lg=the interval between the mark elements M1R and WR of the right-hand alignment marks OR1 and OR2, respectively, and Lh=the interval between the mark elements WR and M2R of the right-hand alignment marks OR1 and OR2.

Figures 5A, 5B:
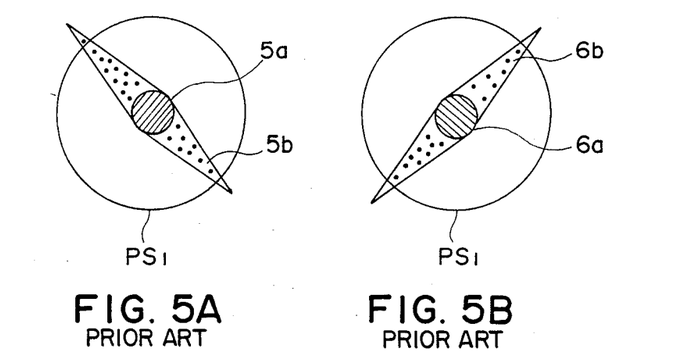
FIGS. 5A and 5B are schematic views, respectively, showing patterns of diffraction lights caused by the alignment marks.

The state of alignment is detected by scanning these alignment marks along a scan line S (FIG. 4A) with the laser beam supplied from the laser source Lo. When the alignment mark elements are scanned by the scan beam S in a direction from left to right, as viewed in FIG. 4A, the scanning beam S, if it is incident on such a portion of the mask M surface or the wafer W surface other than the alignment marks, is reflected specularly by that surface portion and is directed toward the spatial filter F by way of the objective lens O and the beam splitter Bl shown in FIG. 2. The specularly reflected light beam is then incident on the light-blocking portion of the filter F, so that it is intercepted thereby and is not directed to the photodetector D. If, however, the scanning beam S is incident, for example, on a position 4a coincident with the alignment mark element WL, it is scatteringly or diffractively reflected by the edges of the mark element WL, whereby there is produced a diffraction pattern, such as shown at 5b in FIG. 5A and formed by diffracted rays distributed in a direction orthogonal to the direction of elongation of the mark element WL, the pattern being observable in the plane PS1' (FIG. 2). In FIG. 5A, a hatched area 5a of circular shape depicts the diameter of the specularly reflected light (zero-th order diffraction light) from the wafer W surface (or the mask M surface). is incident, e.g. on a position 4b coincident with the alignment mark element WR, it is scatteringly reflected and a diffraction pattern such as shown at 6b in FIG. 5B is produced. In FIG. 5B, the hatched area 6a of circular shape similarly depicts the diameter of the specularly reflected light (zero-th order diffraction light) from the mask surface, similarly to the beam diameter 5a in FIG. 5a.

Figure 6:
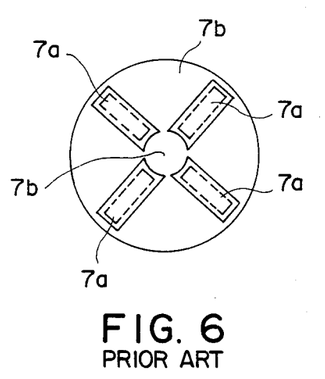
FIG. 6 is a front view schematically showing a spatial filter used in the arrangement of FIG. 2.

The diffraction patterns 5b and 6b shown in FIGS. 5a and 5b have distributions in two orthogonally extending directions, respectively. This is because the alignment mark elements WL and WR extends in two orthogonal directions, respectively. These diffraction patterns 5b and 6b can be observed in the plane PS1' which is optically conjugate with the pupil PSI of the projection system PS (FIG. 2). For this reason, the spatial filter F has its surface disposed in the plane PS1' and is formed with light-transmitting apertures 7a and a light-blocking portion 7b such as shown in FIG. 6. With this arrangement, the photodetector D (FIG. 2) only receives the diffractively scattered light from the mask M surface and from the wafer W surface, whereas the specularly reflected light or the zero-th order diffraction light from these surfaces are intercepted by the spatial filter F.

Figure 4B:
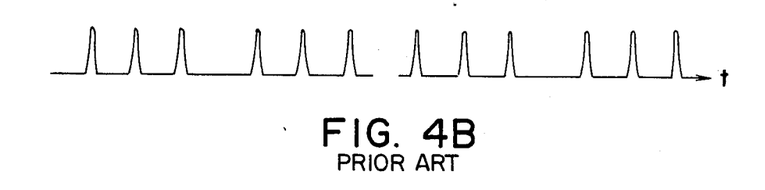
FIG. 4B is a waveform view showing output signals corresponding to the alignment marks shown in FIG. 4A.

Thus, by scanning the mask M surface and the wafer W surface at a constant speed with the scan beam S emitted from the laser source Lo, the positional relations, with respect to time, between the alignment marks OL1 and OL2 and between the alignment marks OR1 and OR2 formed on the mask M and the wafer W can be detected through the photodetector D. If, for example, the positional relations of the alignment marks of the mask M and the wafer W are such as shown in FIG. 4A, alignment mark signals such as shown in FIG. 4B are obtainable from the photodetector D. By counting each of the intervals between these signals, the relative position of the mask M and the wafer W is detected. On the basis of the result of detection, the relative position of the mask M and the wafer W is adjusted so that the mask M and the wafer W are brought into alignment with each other.

Figure 7:
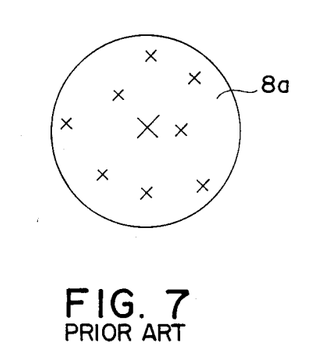
FIG. 7 is a schematic view showing a distribution of diffraction light of noise component, from the mask or the wafer.

In many cases, however, the mask M surface and the wafer W surface are rough and/or contain faults or defects such as scratches or foreign particles. Such roughness or defects of the mask M surface or the wafer W surface cause scattering of the light, which results in formation of a diffraction pattern such as 8a (FIG. 7), on the surface of the spatial filter F, provided by randomly distributed rays as depicted by cross-marks in FIG. 7. Therefore, even if the spatial filter F having apertures 7a shown in FIG. 6 is used, the light rays from the portions of the mask M surface and the wafer W surface other than the alignment marks OL1 OL2, OR1 and OR2, that is the diffraction light of noise component may partially pass through the apertures 7a of the spatial filter F, so that such portion of the diffraction light of noise component as passed through the apertures 7a is incident on the photodetector D. The noise component received by the photodetector D degrades the accuracies of detection of the positions of the alignment marks, which leads to deterioration of the alignment accuracies.

There is another problem in relation to the projection system PS.

Where the projection lens PS shown in FIG. 2 is dual-telecentric, i.e. telecentric with respect to the wafer W side and also to the mask M side, the light beam L1 passed through the mask M in a direction parallel to the optical axis S (FIG. 2) and incident on the projection system PS emerges therefrom in a direction parallel to the optical axis S so that it is perpendicularly incident on the wafer W surface and is focused thereon. If, therefore, the projection system PS is of completely dual-telecentric type, the light-beam L1 after reflected by the wafer W surface goes back along its oncoming path, irrespective of the image height of the projection system PS, used. At this time, the specularly reflected component (zero-th order diffraction component) from the mask M surface or the wafer W surface is intercepted by the light-blocking portion 7b defined at an appropriate position, e.g. a central position, on the surface of the spatial filter F. As the result, the specularly reflected component is not incident on the photodetector D.

Figure 8:
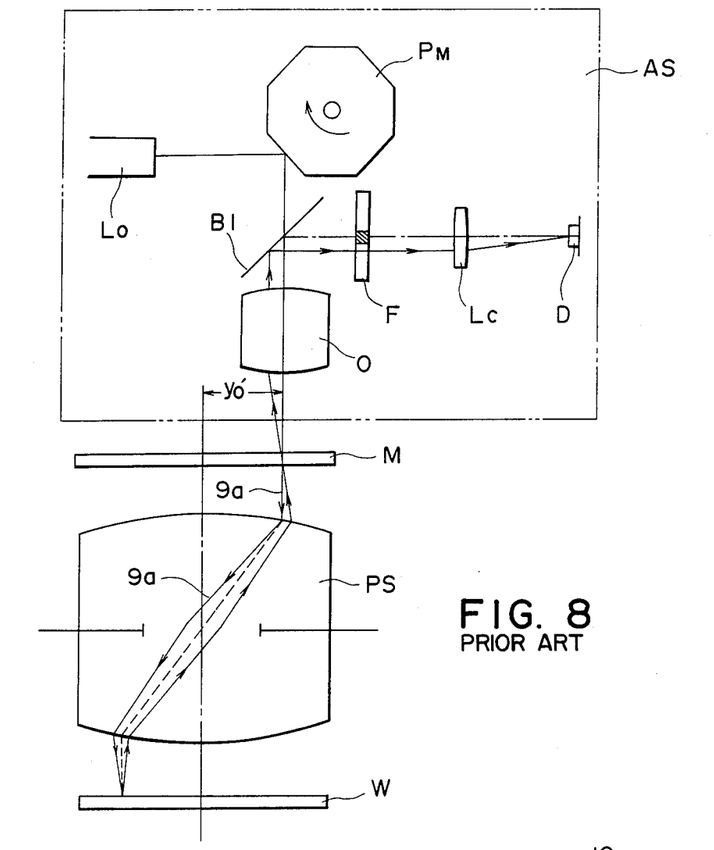
FIG. 8 is a schematic view for illustrating one of the problems peculiar to an alignment detecting optical arrangement.
Figure 9:
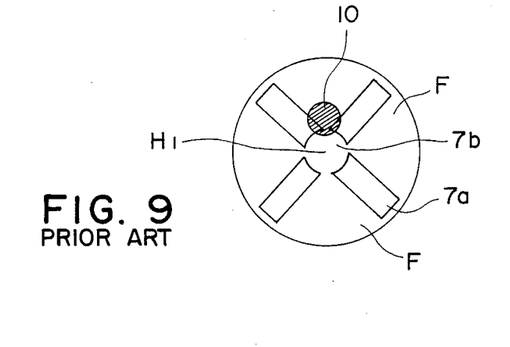
FIG. 9 is a front view of a spatial filter used in the arrangement of FIG. 8, for illustrating a problem in relation to the position of incidence of a specularly reflected light on the filter surface.

Actually, however, the size of the alignment mark to be formed on the mask M and thus the size of the alignment mark to be formed on the wafer W are variable, depending on the size or the like of the actual circuit pattern. Also, the position at which the alignment mark is to be formed is variable accordingly. It is therefore necessary, in some cases, to displace the objective lens O in a plane perpendicular to the optical axis S to thereby change the image height of the projection system PS, to be used for the detection of the alignment mark. If, in such case, the projection system PS does not show the dual-telecentric characteristic with respect to all the image heights, it is possible that the light beam 9a (see FIG. 8) passed through the mask M in a direction parallel to the optical axis S and incident on the projection system PS emerges therefrom in an inclined direction so that it is incident on the wafer W surface inclinedly. Therefore, the light beam reflected by the wafer W surface does not goes back exactly along its oncoming path, so that, after passing through the projection system PS, it advances toward the mask M in a direction not parallel to the optical axis S. This results in that the position of incidence, on the spatial filter F, of the specularly reflected light (zero-th order diffraction component), which otherwise would be incident just on the light-blocking portion 7b of the spatial filter F by way of the objective lens 0, is displaced such as shown in FIG. 9, wherein the specularly reflected light is incident on the surface of the spatial filter F, as a light beam 10, at a position deviated from the center Hl of the light-blocking portion 7b. As the result, a portion of the specularly reflected light passes through the apertures 7a of the spatial filter F, so that such portion of the specularly reflected light is incident on the photodetector D. The failure of correct blocking of the specularly reflected light (zero-th order diffraction component) causes degradation of the alignment accuracies.

With the arrangement of the spatial filter F such as shown in FIG. 6, as described in the foregoing, it is possible that the alignment accuracies are degraded due to the above-described noise components of diffraction light or due to change of position of the alignment mark provided that the projection system PS does not show a complete dual-telecentric characteristic with respect to all the image heights of the projection system.

SUMMARY OF THE INVENTION

It is accordingly a primary object of the present invention to provide an optical device capable of achieving superior spatial-filtering characteristics.

It is another object of the present invention to provide an optical device by which high-accuracy alignment of an object, based on a diffraction light from the object, is assured.

It is a further object of the present invention to provide an optical device which is applicable to an alignment operation for effecting alignment between a mask and a wafer in the course of manufacture of semiconductor devices.

Briefly, according to the present invention, there is provided an optical device including a spatial filter disposed at a location coincident with or in close proximity to a position optically conjugate with a pupil of a projection optical system for projecting a pattern of a mask onto a wafer. The spatial filter is adapted to intercept a light beam specularly reflected by a surface of the mask and/or by a surface of the wafer to thereby allow photoelectric detection of a light beam scatteringly reflected from the mask surface and/or the wafer surface. The spatial filter has a variable geometry filtering portion to assume high-accuracy photoelectric detection of the scatteringly reflected light beam.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 10:
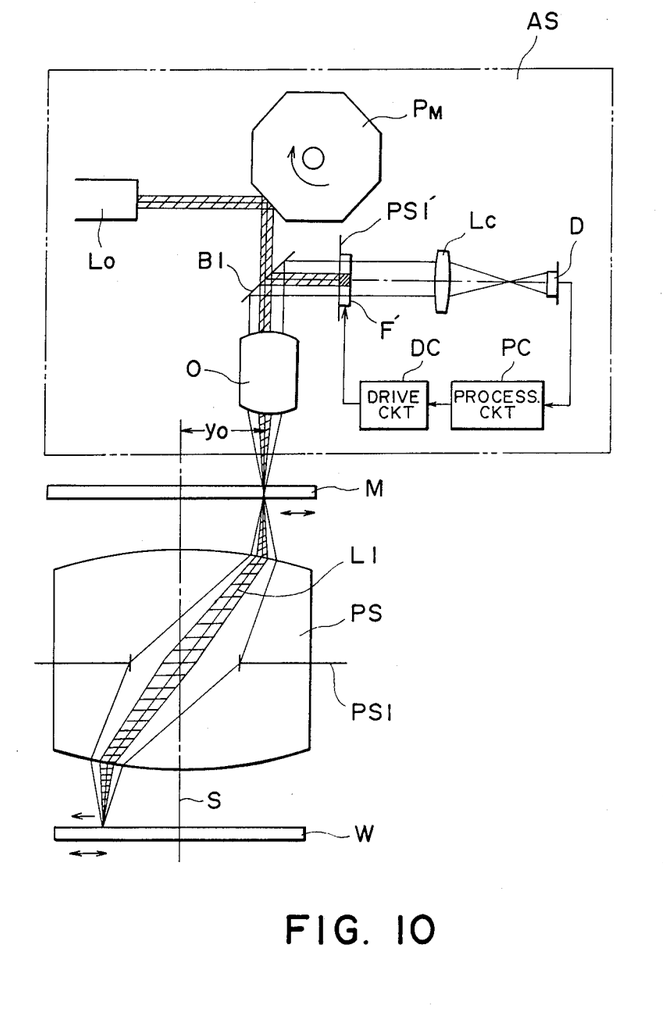
FIG. 10 is a schematic and diagrammatic view of an optical device according to one embodiment of the present invention.

Referring now to FIG. 10, there is shown an optical device according to one embodiment of the present invention, which is applied to an alignment and exposure apparatus of projection type for use in the manufacture of semiconductor devices. Since a large portion of the optical arrangement shown in FIG. 10 is similar to that shown in FIG. 2, detailed description to elements corresponding to those of the FIG. 2 arrangement will be omitted here for the sake of simplicity of explanation, only by assigning the same reference numerals to the corresponding elements.

Figure 11A:
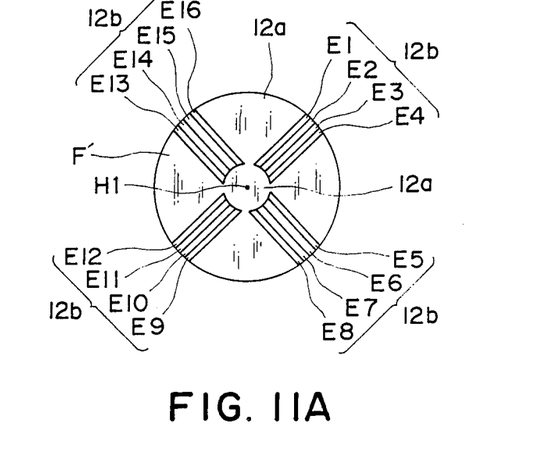
FIG. 11A is a front view schematically showing a spatial filter used in the optical device shown in FIG. 10.

The optical device shown in FIG. 10 includes a spatial filter F' having variable geometry apertures, such as shown in FIG. 11A, for effecting spatial filtering relative to the light beams reflected from the mask M surface and from the wafer W surface. The spatial filter F' has a light-blocking portion such as at 12a in FIG. 11A and light-transmitting portions such as at 12b in FIG. 11A provided by liquid crystal shutter elements E1–E16. Details of the light-transmitting portions will be described later.

On the surface of the mask M and on the surface of the wafer W, there are formed alignment marks OL1, OL2, OR1 and OR2 similar to those shown in FIGS. 3A and 3B, respectively. The diffraction lights reflected from these alignment marks on the mask M surface and the wafer W surface are incident on a plane PS1' which is optically conjugate with the pupil PSl of the projection system PS. As shown in FIG. 10, the surface of the spatial filter F' is disposed in this plane PS1'.

According to the present invention, the geometry (the size, shape and position) of each light-transmitting portion and thus the geometry of the light-blocking portion of the spatial filter F' are made changeable mechanically or electrically. Namely, on the plane PS1', there appears a distribution of diffracted rays of noise component from the mask M surface and from the wafer W surface, as described in the foregoing. Also, the position of incidence, on the plane PS1', of the specularly reflected light from the mask M surface and from the wafer W surface would be changed according to the difference in the image height, to be used, of the projection system PS if it is not completely telecentric with respect to all the image heights. In view of these problems, the spatial filter F' according to the present invention is arranged such that the size, shape and position of each of the light-transmitting portions and thus the light-blocking portion can be variably determined in an appropriate manner.

FIG. 11A shows the one embodiment of the spatial filter F' This spatial filter F' is so disposed in the optical arrangement of FIG. 10 that the center H1 of the light-blocking portion 12a is substantially coincident with the center of the regularly reflected light (zero-th order diffraction component) when it is incident on the surface of the spatial filter F'. For this purpose, the spatial filter F' is made movable in a plane perpendicular to the optical axis as defined by the reflection by the half mirror B1, by means of an unshown mechanical driving system. The positioning of the spatial filter F' in the direction perpendicular to the optical axis can be easily achieved by monitoring the output of the photodetector D. That is, while supplying a specularly reflected light to the spatial filter F', and while displacing the spatial filter F' in the direction perpendicular to the optical axis, the output of the photodetector D is monitored. When the output of the photodetector D becomes equal to or substantially equal to zero, the spatial filter F' is held at that position.

As described in the foregoing, the spatial filter F' has four light-transmitting portions 12b extending in two orthogonal directions. Each of the light-transmitting portions 12b includes four liquid crystal shutter elements E1–E4; E5–E8; E9–E12; E13–E16. Each of the liquid crystal shutter elements E1–E16 has two interchangeable modes, a light-transmitting mode and a light-blocking mode. By changing the mode of selected one or ones of the liquid crystal shutter elements, the geometry of the light-transmitting portions 12b and therefore the geometry of the light-blocking portion 12a of the spatial filter F' can be changed. Of course, each of the light-transmitting portions 12b may be replaced by variable-width blade means.

Figure 11B:
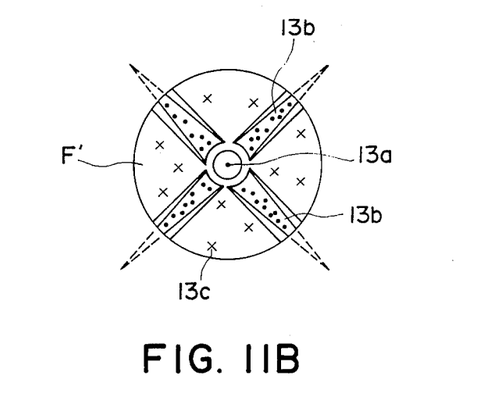
FIG. 11B is a schematic view for illustrating spatial filtering by the spatial filter of FIG. 11A.

Now, the spatial filtering for the diffraction components providing such patterns as shown at 13b in FIG. 11B and for the noise diffraction components providing a diffusively distributed pattern such as shown by the cross-marks 13c in FIG. 11B is considered. The diffraction components caused by the alignment marks OL1, OL2, OR1 and OR2 and providing the diffraction patterns 13b can be detected by the photodetector D, if all the liquid crystal shutter elements E1–E16 of the light-transmitting portions 12b are actuated into or held in the light-transmitting mode. If, however, there is a large amount of noise diffraction component 13c as having a diffusibly distributed pattern, on the surface of the spatial filter F', only those of the liquid crystal shutter elements E1–E16 as denoted by reference characters E2, E3, E6, E7, E10, E11, E14 and E15 are actuated into or held in the light-transmitting mode while the remaining liquid crystal shutter elements are maintained in the light-blocking mode. By doing so, the amount of noise component to be received by the photodetector D decreases to approximately a half of that which otherwise would be received by the photodetector D where all the liquid crystal shutter segments E1–E16 are in the light-transmitting mode, although the level of the signal components corresponding to the diffraction light from the alignment marks OLI, OL2, OR1 and OR2 is also decreased slightly As the result, the signal-to-noise ratio is improved significantly.

For this purpose, a drive circuit DC is provided which is connected to the spatial filter F' to control the operation mode of each of the liquid crystal shutter elements E1–E16 independently from the others. The drive circuit DC is operated in accordance with an instruction signal supplied thereto from a processing circuit connected to the photodetector. With this arrangement, an appropriate combination of the liquid crystal shutter elements which are to be operated in the light-transmitting mode can be determined while monitoring through the output of the photodetector.

Another form of the spatial filter F' will now be described with reference to FIG. 12A. In this embodiment, the spatial filter F' is fixedly secured so that it does not move even if the position of incidence, on the plane PS1', of the specularly reflected light (zero-th order diffraction component) from the mask M surface and from the wafer W surface is displaced. That is, according to this embodiment, the center of the light-blocking portion 12a of the spatial filter F' can always be aligned with the displaced center of the specularly reflected light incident on the surface of the spatial filter F', without moving the spatial filter F'.

Figure 12A:
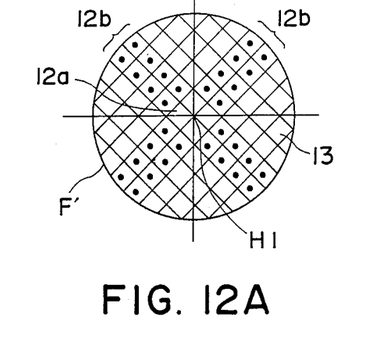
FIG. 12A is a front view schematically showing a spatial filter used in an optical device according to another embodiment of the present invention.
Figure 12B:
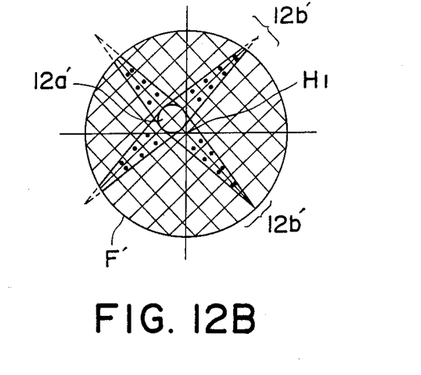
FIG. 12B is a schematic view for illustrating spatial filtering by the spatial filter of FIG. 12A.

As shown in FIG. 12A, the spatial filter F' has formed on its surface a number of small liquid crystal segments 13 each of which is arranged to be actuated or deactuated independently from the others. Normally, for example, those of the liquid crystal segments 13 as denoted by dots in FIG. 12A are held in the light-transmitting mode. If the position of incidence of the specularly reflected light is deviated from the center H1 of the light-blocking portion 12a, the modes of appropriate ones of the liquid crystal segments 13 are changed, i.e. from the light-transmitting mode to the light-blocking mode or from the light-blocking mode to the light-transmitting made, so that light-transmitting potions, such as shown at 12b' in FIG. 12B, defined by the liquid crystal segments 13 as marked by dots in FIG. 12B are newly established. By this, the specularly reflected light from the mask M surface and from the wafer W surface can be fully intercepted by a thus newly defined light-blocking portion 12a', irrespective of deviation of the position of incidence of the specularly reflected light on the surface of the spatial filter F'. The determination of selection of the liquid crystal segments for defining the light-blocking portion 12a' and for defining the light-transmitting portions 12b' will be described later.

Figure 13A:
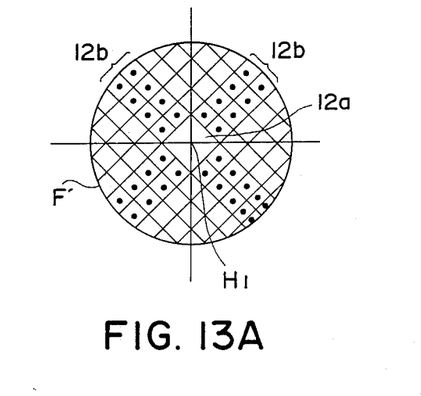
FIG. 13A is a front view schematically showing a spatial filter used in an optical device according to a further embodiment of the present invention.

A still another form of the spatial filter F' is shown in FIG. 13A. This embodiment is a slight modification of the FIG. 12A embodiment. As shown in FIG. 13A, the spatial filter F' of this embodiment has a light-blocking portion 12a which is fixedly defined at the central portion of the surface of the spatial filter F'. Except for this point, the structure of this embodiment of the spatial filter F' is the same as that of the FIG. 12A embodiment. Any deviation of the position of incidence of the specularly reflected light on the surface of the spatial filter F' can be met by the deactuating, into the light-blocking mode, appropriate one or ones of the liquid crystal segments constituting, in the state of FIG. 13A, the light-transmitting portions 12b. The prevention of detection of the noise diffraction light 13c (FIG. 11B) can be achieved in substantially the same manner as described with reference to FIGS. 11A and 11B.

Figure 13B:
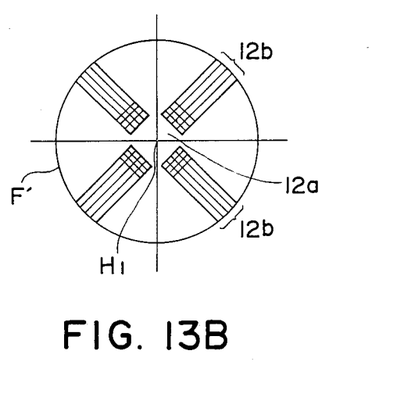
FIG. 13B is a front view schematically showing a spatial filter of an optical device according to a still further embodiment of the present invention.

FIG. 13B shows still another form of the spatial filter F' This embodiment is a modification corresponding to a combined form of the FIG. 11A embodiment with the FIG. 12A embodiment.

As shown in FIG. 13B, the spatial filter F' has a light-blocking portion 12a which is fixedly defined at a central area of the surface of the spatial filter F' as well as four light-transmitting portions 12b extending in two orthogonal directions. Each of the light-transmitting portions 12b is formed by a plurality of small liquid crystal segments disposed at the region of the light-transmitting portion 12b adjacent to the light-blocking portion 12a and by a plurality of elongating liquid crystal elements disposed in the remaining region of the light-transmitting portion 12b. That is, within such an area of the surface of the spatial filter F' in which area the displacement of the position of incidence of the specularly reflected light is liable to occur, each of the light-transmitting portions 12b is provided by minute liquid crystal segments each of which is operable independently from each other. Therefore, more accurate control of the geometry of the light-transmitting portions 12b is attainable against any deviation of the position of incidence of the specularly reflected light on the surface of the spatial filter F'. On the other hand, at the peripheral portion of the surface of the spatial filter F', each of the light-transmitting portions 12b is formed by the elongating liquid crystal elements extending in a direction corresponding to the direction of elongation of distribution of a corresponding one of the diffraction patterns to be caused by the alignment marks OL1, OL2, OR1 and OR2, as described with reference to FIG. 11B.

Turning now to FIG. 10, the adjustment of the spatial filter F' according to the FIG. 12A embodiment or the FIG. 13B embodiment will be described in more detail.

The geometrical arrangement of the light-blocking portion 12a and the geometrical arrangement of the light-transmitting portions 12b of the spatial filter F' are changed by interchanging the modes, i.e. the light-transmitting mode and the light-blocking mode, of each of the liquid crystal segments constituting the light-transmitting portions 12b. This interchange of the modes is achieved by a driving circuit, such as shown at DC in FIG. 10, connected to the spatial filter F'. More specifically, the driving circuit DC drives each of the liquid crystal segments in response to an instruction signal supplied thereto from a processing circuit, such as shown at PC in FIG. 10, for processing the output of the photodetector D. The processing circuit PC is arranged to determine a particular combination of the liquid crystal segments to be made into or to be held in the light-transmitting mode, which combination is most suitable to make the level of the output of the photodetector D minimum when the laser beam emitted from the laser source Lo is incident on a mirror surface portion of the mask M surface or on a mirror surface portion of the wafer W surface other than the alignment marks OL1, OL2, OR1 and OR2.

Also, the driving circuit DC is arranged so that it is actuated in response to an instruction signal supplied thereto from an unshown operation switch to change the modes of each of the liquid crystal segments. For example, where the wafer W surface is coated with a vacuum deposition of aluminum material which tends to increase the noise diffraction component, or where a large amount of foreign particles are adhered to the mask M surface and/or the wafer W surface which leads to increase in the noise component, the size of each of the light-transmitting portions 12a can be made smaller by a manual operation.

In the above-described embodiments, e.g. in the embodiment of FIG. 11A, if there exists any liquid crystal segment, of the segments E1–E16, whose operation mode can be fixedly maintained in the light-transmitting mode, then the portion of the surface of the spatial filter F' corresponding to such liquid crystal segment may be cut out to form a notch or window in order that the diffraction components produced by the alignment marks OL1, OL2, OR1 and OR2 are directed more effectively to the photodetector D.

Where the liquid crystal devices are used to provide the spatial filter F', it is necessary to use a polarized beam. If a laser is to be employed as a source of the beam, a linear-polarization type one may be used. Where an Hg lamp, a halogen lamp or a light emitting device is used, a polarizing plate may be used to polarize the beam.

In the embodiments as described in the foregoing, the light-transmitting portions 12b of the spatial filter F' extend in two directions inclined oppositely with an angle of 45 degrees, i.e. extending orthogonally to each other, because the alignment marks formed on the mask M surface and the wafer W surface are provided by mark elements which are inclined, oppositely to each other, with an angle of 45 degrees relative to the direction of scan of the beam. However, this is not limiting. That is, the alignment mark may have any desired inclination, so that the light-transmitting portion of the spatial filter may have an appropriate inclination according to the inclination of the alignment mark.

While, in the foregoing embodiments, the invention has been described with reference to an alignment and exposure apparatus having a projection system composed of lenses or mirrors, the invention is applicable also to a contact type exposure apparatus wherein the mask and the wafer is held in contact with each other and wherein the exposure is effected without using a projection system, and further to a proximity type exposure apparatus wherein a minute gap such as of an order of several tens of microns are maintained between the mask and the wafer and wherein the exposure is effected without any projection system.

Further, the "filter" referred to herein means not only a substantive filter element provided on a transparent member but also an optically equivalent element.

While the invention has been described with reference to the structures disclosed herein, it is not confined to the details set forth and this application is intended to cover such modifications or changes as may come within the scope of the following claims.

What is claimed is:

1. An optical device, comprising:
   an illumination system for illuminating an object with light; and
   detecting means for receiving light from the object illuminated by said illumination system, said detecting means including (i) filter having a variable geometry filtering portion for spatially filtering the light from the object to extract a scattered component of the light and (ii) a sensor for sensing the light component extracted by said filter.

2. A device according to claim 1, wherein said filtering portion of said filter includes a plurality of filter segments each having interchangeable modes of light-transmission and light-interception.

3. A device according to claim 2, wherein the mode of each of said filter segments of said filter is changed in response to an electric signal.

4. A device according to claim 1, wherein said filtering portion of said filter includes a plurality of filtering segments each having interchangeable modes of light-transmission and light-interception, and wherein said filtering segments are disposed around an area of said filter to which area a specularly reflected component of the light beam from the object is directed.

5. A device according to claim 4, wherein, of said filtering segments, a filtering segment disposed in proximity to the area of said filter, to which area the specularly reflected component of the light beam from the object is directed, is smaller in size than a filtering segment is disposed at a position more remote from the aforesaid area of said filter than the first-mentioned filtering segment.

6. A device according to claim 1, wherein said illumination system includes a projection means for projecting a predetermined pattern onto the object and conjugate means for bringing a pupil of said projection means and said filter into substantially an optically conjugate relation.

7. A device according to claim 1, wherein said variable geometry filtering portion of said filter includes a light-transmitting portion and a light-blocking portion whose positions are variable.

8. A device according to claim 7, wherein said variable geometry filtering portion of said filter includes a plurality of filtering segments each having interchangeable modes of light-transmission and light-interception.

9. An optical device comprising:
   an illumination system for illuminating an object with light; and
   detecting means for receiving light from the object illuminated by said illumination system, said detecting means including (i) a filter having a variable geometry filtering portion for spatially filtering the light from the object to extract a scattered component of the light and (ii) a sensor for sensing the light component extracted by said filter;
   wherein the geometry of said variable geometry filtering portion of said filter is changeable in accordance with an output of said sensor.

10. An optical device according to claim 9, wherein said filter blocks a specularly reflected component of the light from the object and extracts said scattered component of the light from the object and wherein the geometry of said variable geometry filtering portion of said filter is changeable in accordance with an output of said sensor when said sensor senses the light coming, by way of said filter, from a portion of the object on which no mark is formed.

11. An optical device usable in a projection exposure apparatus having a projection optical system for projecting a pattern of a mask on a wafer, for detecting a mark formed on the wafer through the projection optical system, said device comprising:
   an illumination system for illuminating the wafer with light;
   detecting means for receiving light coming, by way of the projection optical system, from the wafer illuminated by said illumination system, said detecting means including (i) a filter having a variable geometry portion for spatially filtering the light from the wafer to extract a scattered component of the light and (ii) a sensor for sensing the light component extracted by said filter; and
   adjusting means for adjusting the geometry of said variable filtering portion of said filter in accordance with an image height of the projection optical system used for the detection of the mark.

* * * * *

UNITED STATES PATENT AND TRADEMARK OFFICE
CERTIFICATE OF CORRECTION

PATENT NO. : 4,865,455

DATED : September 12, 1989

INVENTOR(S) : MICHIO KOHNO, ET AL.

It is certified that error appears in the above-identified patent and that said Letters Patent is hereby corrected as shown below: On Title page

IN [57] ABSTRACT

Line 11, "assume" should read --assure--.

COLUMN 1

Line 60, "objective lens 0" should read
    --objective lens O--.

COLUMN 3

Line 24, "objective lens 0" should read
    --objective lens O--.
    Line 40, "M surface). is" should read --M surface). ¶ If, on the other hand, the scanning beam S is--.
    Line 51, "extends" should read --extend--.
    Line 54, "pupil PSI" should read --pupil PS1--.

COLUMN 4

Line 46, "reflected" should read --being reflected--.

COLUMN 5

Line 7, "goes" should read --go--.
    Line 15, "objective lens 0," should read
    --objective lens O,--.

COLUMN 6

Line 17, "hen" should read --when--.

UNITED STATES PATENT AND TRADEMARK OFFICE
CERTIFICATE OF CORRECTION

PATENT NO. : 4,865,455

DATED : September 12, 1989

INVENTOR(S) : MICHIO KOHNO, ET AL.

It is certified that error appears in the above-identified patent and that said Letters Patent is hereby corrected as shown below:

COLUMN 7

Line 40, "filter F' This" should read --filter F'. This--.

COLUMN 8

Line 31, "slightly As" should read --slightly. As--.
    Line 68, "made," should read --mode,--.

COLUMN 9

Line 30, "F' This" should read --F'. This--.

COLUMN 10

Line 67, "is" should read --are--.

Signed and Sealed this

Twenty-ninth Day of December, 1992

*Attest:*

DOUGLAS B. COMER

*Attesting Officer*     *Acting Commissioner of Patents and Trademarks*